(12) United States Patent
Lee et al.

(10) Patent No.: US 6,706,642 B2
(45) Date of Patent: Mar. 16, 2004

(54) METHOD FOR FABRICATING SEMICONDUCTOR CAPACITORS

(75) Inventors: Dong Ho Lee, Kyoungsangbuk-do (KR); Jong Woon Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/330,565

(22) Filed: Dec. 27, 2002

(65) Prior Publication Data

US 2003/0176077 A1 Sep. 18, 2003

(30) Foreign Application Priority Data

Mar. 13, 2002 (KR) ................................ 10-2002-0013630

(51) Int. Cl.$^7$ .......................................... H01L 21/302
(52) U.S. Cl. ....................... 438/745; 438/749; 438/750; 438/753; 438/754
(58) Field of Search ..................... 438/745, 749, 438/750, 753, 754

(56) References Cited

U.S. PATENT DOCUMENTS

| | | | |
|---|---|---|---|
| 5,877,063 A | | 3/1999 | Gilchrist |
| 6,146,966 A | * | 11/2000 | Hirota et al. ............... 438/398 |
| 6,194,266 B1 | * | 2/2001 | Chen et al. ................. 438/255 |
| 6,211,010 B1 | | 4/2001 | Lee et al. |
| 6,333,227 B1 | * | 12/2001 | Kim et al. .................. 438/255 |
| 6,492,243 B2 | * | 12/2002 | Reinberg .................... 438/396 |

FOREIGN PATENT DOCUMENTS

JP        315780        11/2000

* cited by examiner

*Primary Examiner*—Nadine Norton
*Assistant Examiner*—Binh X. Tran
(74) *Attorney, Agent, or Firm*—Ladas & Parry

(57) ABSTRACT

The present invention relates to a method for fabricating semiconductor capacitors, which enables the capacitance of the capacitors to be increased. This method comprises the steps of: forming a cylinder type polycrystalline silicon pattern on a semiconductor substrate; forming an amorphous metal film on the substrate in such a manner that the amorphous metal film covers the polycrystalline silicon pattern; crystallizing the amorphous metal film so as to form grown metal grains and grain boundaries between the metal grains; firstly etching the crystallized metal film by a wet etching process in such a manner that the polycrystalline silicon pattern is selectively exposed due to the difference in the wet etching rate between the metal grains and the grain boundaries; secondly etching the exposed portion of the polycrystalline silicon pattern by a wet etching process so as to form a storage node electrode whose surface has hemispherical grooves; and successively forming a dielectric layer and a plate electrode on the resulting structure in such a manner that they cover the storage node electrode.

7 Claims, 8 Drawing Sheets

METHOD FOR FABRICATING SEMICONDUCTOR CAPACITORS

BACKGROUND OF THE INVENTION

1. Field of the Invention

The present invention relates in general to a method for fabricating semiconductor capacitors, and more particularly to a method for fabricating semiconductor capacitors, which enables the capacitance of the capacitors to be increased.

2. Description of the Prior Art

As the integration density of a semiconductor device fabricated on a semiconductor substrate is increased, an area that can be occupied by a capacitor cell for data storage in a DRAM device is also reduced. Thus, the capacitance of the capacitor fabricated on a semiconductor wafer is decreased with a reduction in design rule.

However, in a DRAM capacitor cell, in order to ensure strong resistance against soft error caused by an alpha particle and to prevent malfunction caused by noise, there is required a capacitor cell having sufficient capacitance.

Namely, even in the case of a giga-bit DRAM capacitor cell having a design rule of deep-sub-half-micron, it is known in the art that a capacitance of at least 30 femto Farad (fF) needs to be ensured.

In an attempt to fabricate capacitors of high capacitance on a semiconductor substrate at an acceptably limited area, there was proposed a method where hemispherical grains (HSG) are grown in a stacked or cylindrical structure.

Figure 1A:
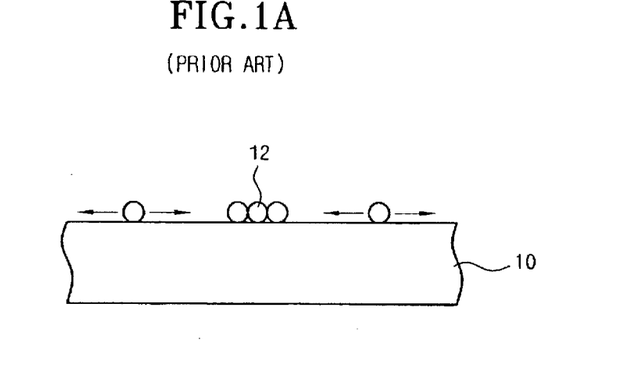
FIGS. 1a to 1c are drawings illustrating the mechanism of hemispherical grain (HSG) growth according to the prior art.
Figure 1B:
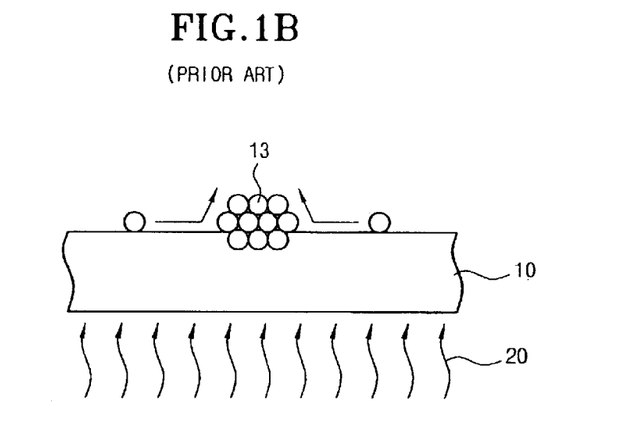
Figure 1C:
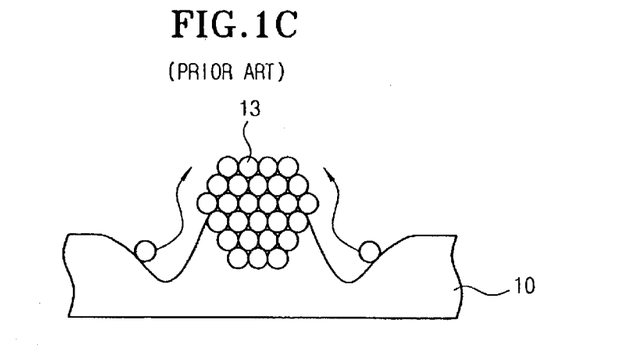

FIGS. 1a to 1c are drawings illustrating a method for fabricating semiconductor capacitors according to the prior art, which show the mechanism of hemispherical grain (HSG) growth.

The hemispherical grain (HSG) growth mechanism will now be described. As shown in FIG. 1, amorphous silicon nuclei 12 are first deposited on the surface of a polycrystalline silicon layer 10 of a substrate (not shown). As shown in FIG. 1b, the surface of the resulting structure is then subjected to a thermal treatment process 20, so that polycrystalline silicon atoms are diffused and crystallized with respect to the deposited silicon nuclei 12. As shown in FIG. 1c, the crystallization of the polycrystalline silicon is further accelerated to achieve the hemispherical grain (HSG) growth. Thus, the surface of the polycrystalline silicon is changed into a hemispherical shape, so that the polycrystalline silicon has an increased surface area per unit area. In this way, the capacitance of the capacitors is maintained at constant level, even in the case of a highly integrated semiconductor device.

However, the gap between the capacitors, which are applied in a current 64M-DRAM fabrication process, is about 0.17 μm. In this case, if the polycrystalline silicon nuclei are deposited and the amorphous silicon is crystallized to achieve the hemispherical grain growth, a margin for the gap between the capacitors will be further reduced. Thus, the bridge and contact between the capacitors are generated. In addition, many costs are incurred during the process of the hemispherical grain (HSG) growth, thereby increasing the cost of fabrication.

SUMMARY OF THE INVENTION

Accordingly, the present invention has been made to solve the above-mentioned problems occurring in the prior art, and an object of the present invention is to provide a method for fabricating semiconductor capacitors, by which the generation of the bridge and contact between the capacitors can be prevented and the increase in. fabrication costs can be prevented, and at the same time, the effective surface area of the capacitors can be increased.

To achieve the above object, the present invention provides a method for fabricating semiconductor capacitors, which comprises the steps of: forming a cylinder type polycrystalline silicon pattern on a semiconductor substrate; forming an amorphous metal film on the substrate in such a manner that the amorphous metal film covers the polycrystalline silicon pattern; crystallizing the amorphous metal film so as to form metal grains and grain boundaries; firstly etching the crystallized metal film by a wet etching process in such a manner that the polycrystalline silicon pattern is selectively exposed due to the difference in the wet etching rate between the metal grains and the grain boundaries; secondly etching the exposed portion of the polycrystalline silicon pattern by a wet etching process so as to form a storage node electrode whose surface has hemispherical grooves; and successively forming a dielectric layer and a plate electrode on the resulting structure in such a manner that they cover the storage node electrode.

In the first wet etching step, a mixed solution of $H_3PO_4$, $HNO_3$ and $CH_3COOH$ is preferably used for a wet etching solution.

In the second wet etching step, a mixed solution of HF, $HNO_3$ and $CH_3COOH$ is preferably used for a wet etching solution. Furthermore, the second wet etching step is preferably carried out according to an isotropic etching process.

Preferably, the method of the present invention further comprises the step of removing the metal film remaining after the first wet etching step, after carrying out the second wet etching step. Moreover, the step of removing the remaining metal film is preferably carried out according to a wet etching process. In this case, a mixed solution of $H_3PO_4$, $HNO_3$ and $CH_3COOH$ is preferably used for a wet etching solution.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a method for fabricating semiconductor capacitors to a preferred embodiment of the present invention will be described with reference to the accompanying drawings.

FIGS. 2a to 2g are cross-sectional views, which illustrate a method for fabricating semiconductor capacitors according to a preferred embodiment of the present invention. Also, FIGS. 3a to 3h are drawings, which show a mechanism where the surface area of polycrystalline silicon is increased by the etching rate difference between metal grains and grain boundaries according to the present invention.

Figure 2A:
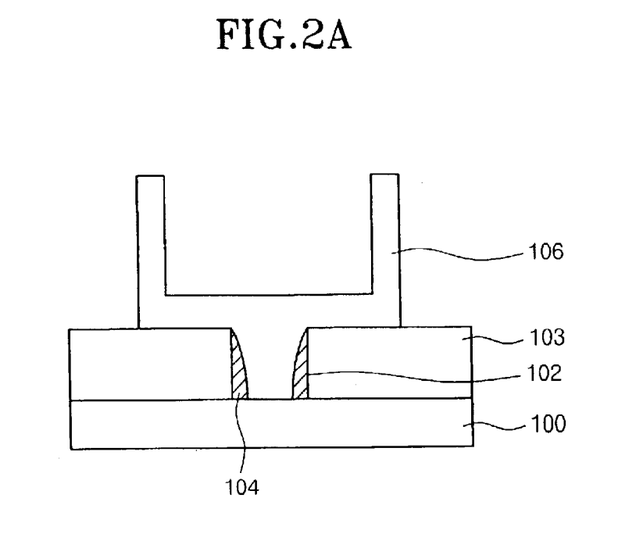
FIGS. 2a to 2g are cross-sectional views, which illustrate a method for fabricating semiconductor capacitors according to a preferred embodiment of the present invention.

As shown in FIG. 2a, a first insulating film 103 is first formed on a semiconductor substrate 100, and then selectively etched so as to form an opening 102 through which the fixed region of the substrate 100 is exposed. At this time, although not shown in the drawing, a transistor including a gate electrode and source/drain regions is fabricated in the substrate 100. The source/drain regions re exposed through the opening 102.

Next, a silicon nitride film is deposited on the insulating film 103 including the opening 102, and then etched until the surface of the insulating film 103 is exposed. Thus, an insulating spacer 104 is formed on the inner sidewall of the opening 102.

Thereafter, a cylinder type polycrystalline silicon pattern 106, which covers the opening 102 including the insulating spacer 104, is formed on the first insulating film 103 according to a conventional method.

Figure 2B:
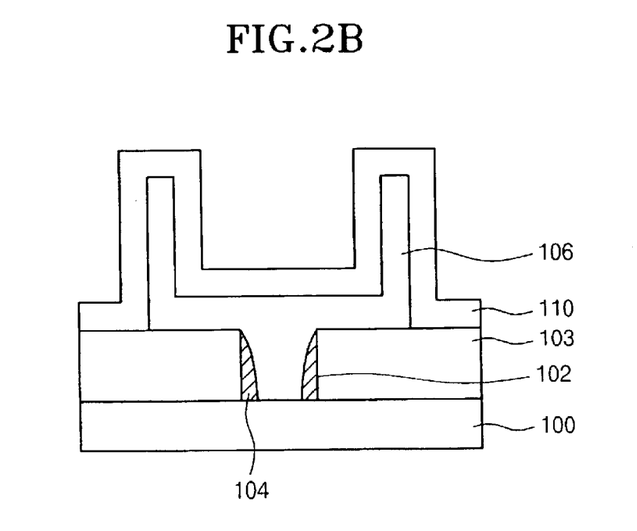
Figure 3A:
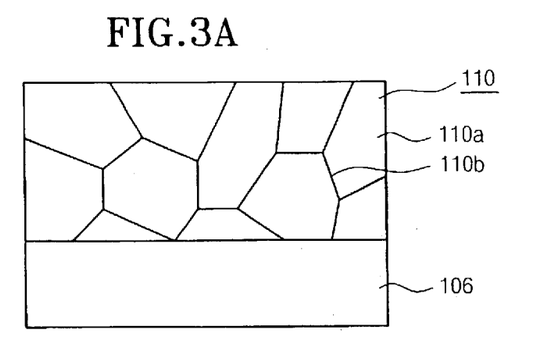
FIGS. 3a to 3h are drawings, which show a mechanism where the surface area of polycrystalline silicon is increased by the etching rate difference between metal grains and grain boundaries according to the present invention.
Figure 3B:
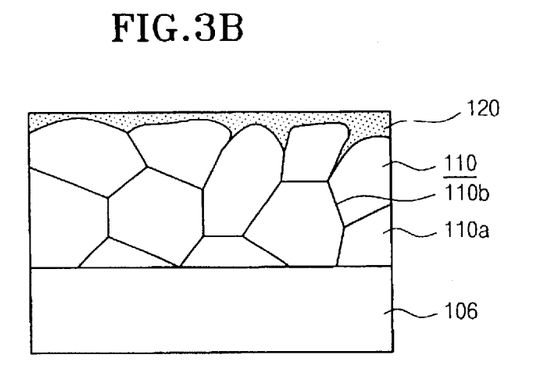
Figure 3C:
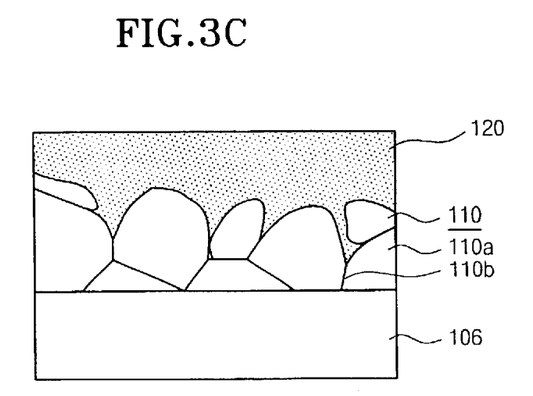

As shown in FIGS. 2b and 3a, an amorphous metal film 110 is then deposited on the insulating film 103 including the polycrystalline silicon pattern 106. The deposited amorphous metal film 110 is crystallized so as to form grown metal grains 110a. At this time, grain boundaries 110b are formed between the metal grains 110a.

Figure 2C:
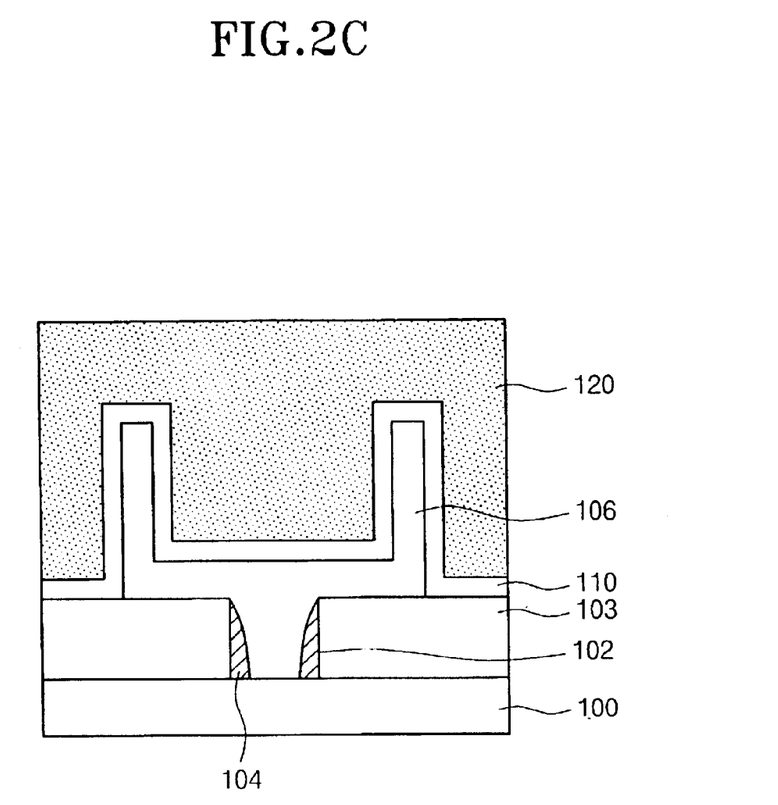

As shown in FIG. 2c, the resulting structure is wet-etched in a bath (not shown) containing a wet etching solution for etching metals. At this time, a mixed solution of $H_3PO_4$, $HNO_3$ and $CH_3COOH$ is used for the wet etching solution 120.

Figure 3D:
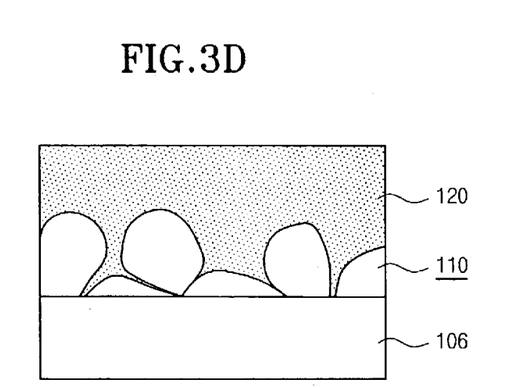

In the wet etching process, the wet etching solution 120 penetrates into the surface of the crystallized metal film 110, and the metal grains 110a and the grain boundaries 110b exhibit different etching rates caused by the wet etching solution. By this etching rate difference between the metal grains 110a and the grain boundaries 110b, the surface of the polycrystalline silicon pattern 106 is selectively exposed, as shown in FIG. 3d. Namely, in the wet etching process, the grain boundaries 110b are rapidly etched as compared to the inside of the grains 110a.

The wet etching process will now be described in more detail. The inside of the grains has a regular lattice arrangement, but the grain boundaries have high stored energy due to an irregular lattice arrangement. Thus, the grain boundaries have relatively high stored energy as compared to the inside of the grains. This grain boundaries having high stored energy are changed to low stored energy and rapidly etched in order to seek for its stability during the wet etching process, as compared to the inside of the grains. For this reason, the grains and the grain boundaries exhibit the different etching rates during the wet etching step.

Figure 2D:
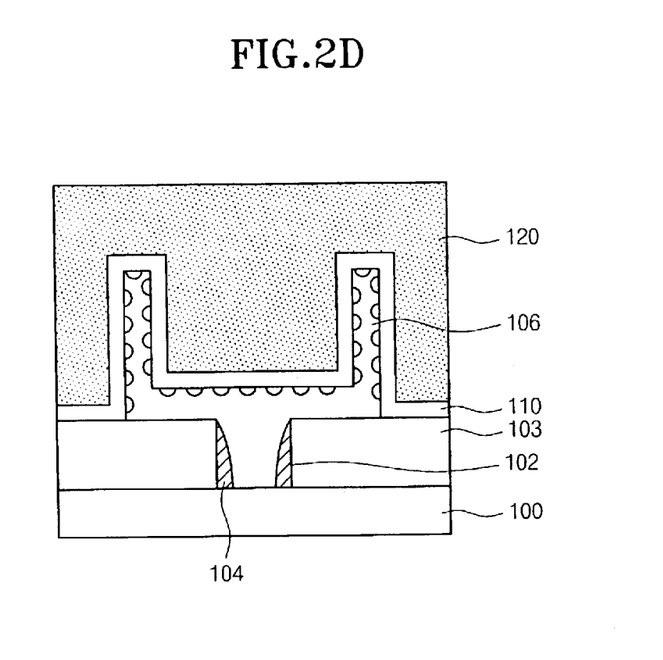
Figure 3E:
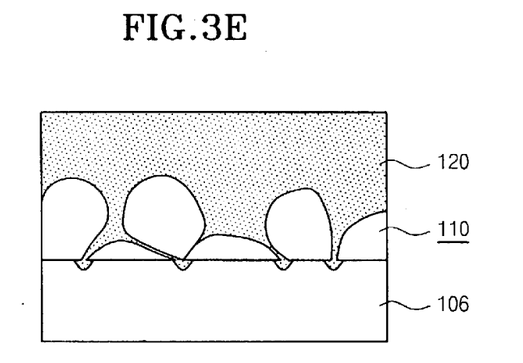
Figure 3F:
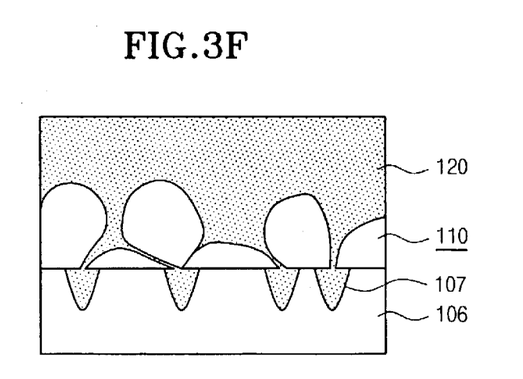

After the surface of the polycrystalline silicon pattern 106 is selectively exposed by the different in the wet etching rate between the grains and the grain boundaries, the polycrystalline silicon pattern 106 is etched by an anisotropic wet etching process, as shown in FIGS. 2d, 3e and 3f. At this time, in order to etch the polycrystalline silicon pattern 106 by the anisotropic wet etching process, a mixed solution of HF, $HNO_3$ and $CH_3COOH$ is used for a wet etching solution 121. Also, the exposed portions of the surface of the polycrystalline silicon pattern 106, which are located between the grain boundaries, start to be etched by the anisotropic wet etching process. At this time, the portion of the metal film remaining on the surface of the polycrystalline silicon pattern 106 serves as a buffer against the wet etching solution of the polycrystalline silicon pattern 106.

Figure 2E:
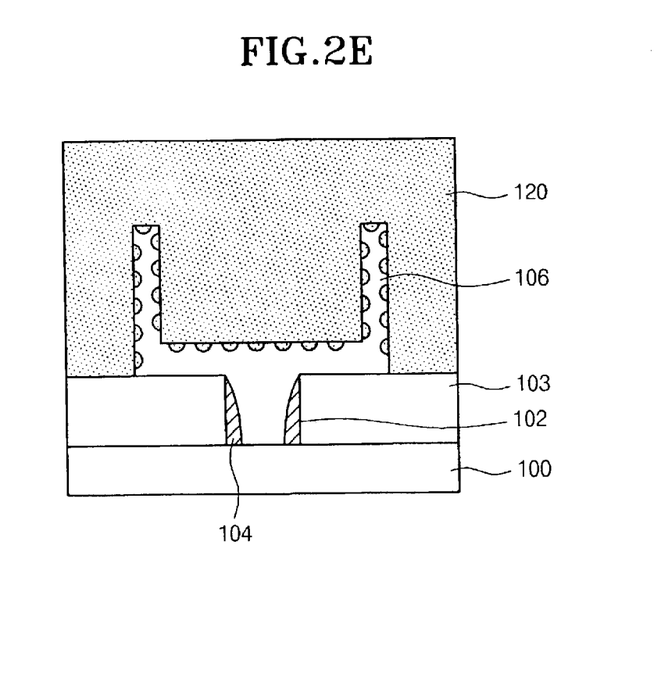
Figure 2F:
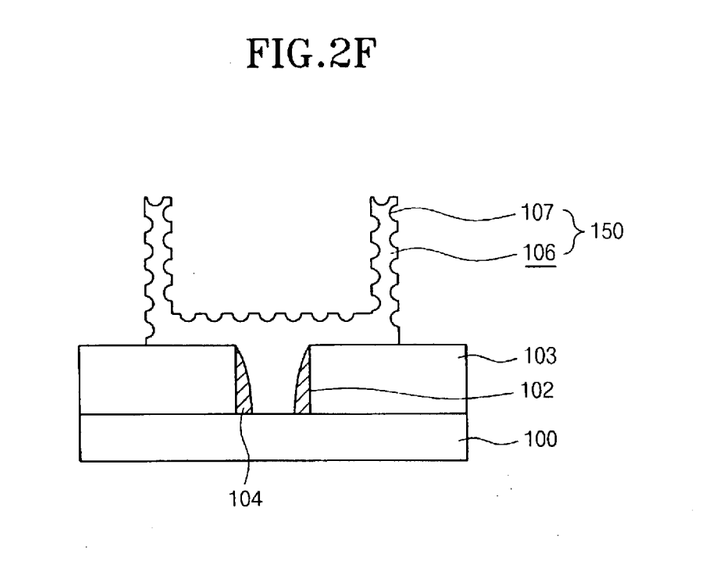
Figure 3G:
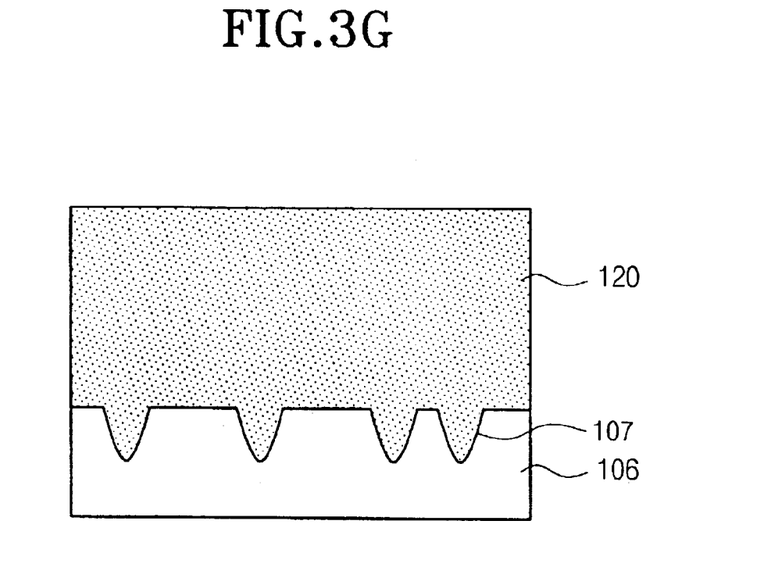
Figure 3H:
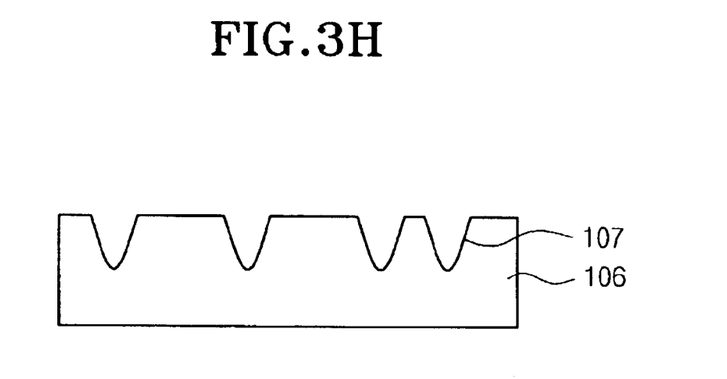

Thereafter, as shown in FIGS. 2e and 3g, the portion of the metal film, which remains on the surface of the polycrystalline silicon pattern 106, is completely removed by means of a wet etching solution for etching metals, which consists of a mixed solution of $H_3PO_4$, $HNO_3$ and $CH_3COOH$. Accordingly, as shown in FIGS. 2f and 3g, hemispherical grooves 107 are formed on the surface of the polycrystalline silicon pattern 106. In this case, the polycrystalline silicon pattern 106 having the hemispherical grooves formed thereon serves as a storage node electrode 150 of capacitors.

Figure 2G:
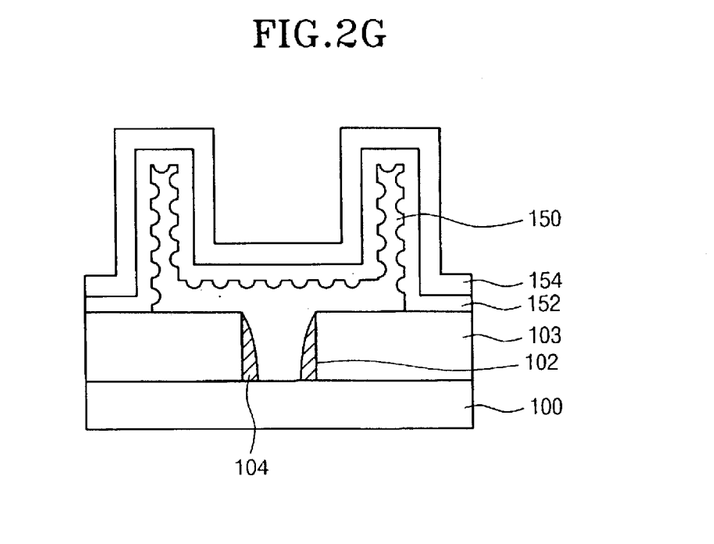

As shown in FIG. 2g, a dielectric layer 152 and a plate electrode 154 are then successively formed on the resulting structure including the. storage node electrode 150. In this way, the capacitors are fabricated.

As described above, according to the present invention, the hemispherical grooves are formed on the surface of the polycrystalline silicon pattern, so that the effective surface area of the capacitors is increased, thereby improving semiconductor device yield.

As a result, according to the method of the present invention, the increase in fabrication costs caused by the hemispherical grain growth can be prevented, and also the reduction in device yield caused by the generation of the bridge and contact between the capacitors can be prevented.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating semiconductor capacitors, which comprises the steps of:

forming a cylinder type polycrystalline silicon pattern on a semiconductor substrate;

forming an amorphous metal film on the substrate in such a manner that the amorphous metal film covers the polycrystalline silicon pattern;

crystallizing the amorphous metal film so as to form grown metal grains and grain boundaries between the metal grains;

firstly etching the crystallized metal film by a wet etching process in such a manner that the polycrystalline silicon pattern is selectively exposed due to the difference in the wet etching rate between the metal grains and the grain boundary;

secondly etching the exposed portion of the polycrystalline silicon pattern by a wet etching process so as to form a storage node electrode whose surface has hemispherical grooves; and successively forming a dielectric layer and a plate electrode on the resulting structure in such a manner that they cover the storage node electrode.

2. The method of claim 1, in which a mixed solution of $H_3PO_4$, $HNO_3$ and $CH_3COOH$ is used for a wet etching solution in the first wet etching step.

3. The method of claim 1, in which a mixed solution of HF, $HNO_3$, and $CH_3COOH$ is used for a wet etching solution in the second wet etching step.

4. The method of claim 1, in which the second wet etching step is carried out according to an isotropic etching process.

5. The method of claim 1, which further comprises the step of removing the metal film remaining after the first wet etching step, after carrying out the second wet etching step.

6. The method of claim 5, in which the step of removing the remaining metal film is carried out according to a wet etching process.

7. The method of claim 6, in which a mixed solution of $H_3PO_4$, $HNO_3$ and $CH_3COOH$ is used for a wet etching solution in the wet etching step.

* * * * *